(12) United States Patent
Botti et al.

(10) Patent No.: US 8,159,796 B2
(45) Date of Patent: Apr. 17, 2012

(54) POWER INTEGRATED CIRCUIT WITH HIGH INSENSITIVITY TO PARASITIC INDUCTANCES OF WIRES FOR CONNECTION TO A PACKAGE AND PACKAGE FOR SAID INTEGRATED CIRCUIT

(75) Inventors: Edoardo Botti, Vigevano (IT); Pietro Mario Adduci, Settimo Milanese (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 845 days.

(21) Appl. No.: 12/209,948

(22) Filed: Sep. 12, 2008

(65) Prior Publication Data
US 2009/0073625 A1  Mar. 19, 2009

(30) Foreign Application Priority Data
Sep. 14, 2007  (EP) .................................. 07425570

(51) Int. Cl.
*H02H 9/00* (2006.01)
(52) U.S. Cl. ......................................... 361/91.1; 361/18

(58) Field of Classification Search ................. 361/91.1, 361/18
See application file for complete search history.

(56) References Cited

U.S. PATENT DOCUMENTS
7,332,943 B2 * 2/2008 Botti et al. ..................... 327/112
7,872,459 B2 * 1/2011 Hojo et al. ..................... 323/273

FOREIGN PATENT DOCUMENTS
DE    10158112 C1   11/2001
EP    1696487 A1    2/2006

* cited by examiner

*Primary Examiner* — Stephen W Jackson
(74) *Attorney, Agent, or Firm* — Seed IP Law Group PLLC

(57) ABSTRACT

The present disclosure relates to an integrated circuit and a package on which such integrated circuit is placed, the latter having a power output stage, at least one first pad, one second pad and one drive circuit for driving said power output stage, wherein the integrated circuit is characterized in that it has at least one additional third pad, other than said at least one first and said at least one second pads, said drive circuit being electrically coupled between said at least one third pad and said power output stage.

53 Claims, 10 Drawing Sheets

US 8,159,796 B2

POWER INTEGRATED CIRCUIT WITH HIGH INSENSITIVITY TO PARASITIC INDUCTANCES OF WIRES FOR CONNECTION TO A PACKAGE AND PACKAGE FOR SAID INTEGRATED CIRCUIT

BACKGROUND

1. Technical Field

The present disclosure relates to an integrated power circuit and the package on which such integrated circuit is placed, and particularly, but without limitation, to a switching power integrated circuit with high insensitivity to parasitic inductances of the wires for connection with a package.

2. Description of the Related Art

One known problem of power integrated circuits, that is susceptible of causing malfunctioning, is the inevitable parasitic inductance of connecting wires for connection of the integrated circuit with a package.

For example, with reference to FIG. 1, which shows a perspective view of a power integrated circuit 1 when placed on a package 2, the connection between the integrated circuit 1 and the package 2 is found to occur by means of one or more connection wires 5.

Particularly, the integrated circuit 1 may be a MOSFET power transistor or an Insulated Gate Bipolar Transistor (IGBT), whereas the package 2 may be a package having ten pins P1-P10 for mechanical and electrical connection with the tracks of a Printed Circuit Board (not shown), and a metal back plate 3 for mechanical and electrical connection with a pad of the PCB.

Thus, connection between the integrated circuit 1 and the package 2 is ensured by a connection wire 5 that electrically connects a source pad 4 of the integrated circuit 1 with the pin P7, which is in turn connected with the PCB.

Likewise, both the drain terminal and the gate terminal of the integrated circuit 1 are connected by connection wires (not shown) to respective pins of the package 2, which are in turn electrically and mechanically connected to the metal tracks of the PCB.

As is known, if the integrated circuit is based on the MOSFET technology, the source pad 4 of the integrated circuit 1 is caused to contact the source regions of all the basic MOSFET units implemented in the integrated circuit to thereby form a single source pad 4.

Referring now to FIG. 2, which shows an electric circuit diagram of the integrated circuit 1, if the latter is constructed using the MOSFET technology, such integrated circuit has a power output stage 1A implemented by an n-channel MOS power transistor M1, which is driven through its gate terminal GM1 by a driving stage 6.

The integrated circuit 1 is arranged to be powered through a voltage generator Va, and an external load $Z_{load}$ is connected to the drain pad 7, i.e., the drain terminal DM1 of the transistor M1 is connected to the load $Z_{load}$ through the drain pad 7.

The driving circuit 6 is formed, for instance, of a voltage generator Vd and a resistor Rd connected in series.

For instance, the voltage generator Vd may be implemented as an integrated inverter system, whereas the resistor may be implemented as a MOS transistor operating in the triode region.

Still referring to FIG. 2, it shall be noted that the equivalent circuit of the parasitic inductance introduced by the connection wire 5 existing between the source pad 4 and the negative pole of the voltage generator Va is represented by the inductance $L_{par}$.

As a complement to the description, it shall be noted that there is also a parasitic inductance in series with the load $Z_{load}$ but, for the purposes of the present disclosure, its effect is negligible, wherefore it is omitted for simplicity.

Assuming that the generator Vd of the drive circuit 6 generates a square-wave voltage, the current derivative $IL_{par}$ flowing into the inductor $L_{par}$ in time t generates a voltage $VL_{par}$ at the ends of the inductor, which is given by the following relation:

$$VL_{par}=L_{par}dIL_{par}/dt$$

In real cases, the voltage $VL_{par}$ may also be of considerable value, and this may lead to malfunctions of the integrated circuit 1, not excluding any irreparable damages thereto.

Referring to FIG. 3, there is shown a waveform 8 of the voltage (in solid line) that can develop at the ends of the inductance $L_{par}$, i.e., the voltage existing at the source pad 4, when the generator Ld drives the terminal GM1 of the transistor M1 with a voltage having, for instance, a stepped curve, ranging from 0V to 3.3V.

It can be noted that, considering the values of load, inductance $L_{par}$, current, etc., the circuit implementation as shown in FIG. 2 can give rise to overvoltages that cause a pulsed voltage increase of the source pad 4 to values exceeding −22V.

Referring now to FIG. 4, there is shown a waveform 9 of the output voltage (in solid line) that can develop at the ends of the load impedance $Z_{load}$, i.e., the voltage existing at the drain pad 7, when the generator Vd drives the terminal GM1 of the transistor M1 with a voltage having a stepped curve, with steps ranging from 0V to 3.3V.

It can be noted that the circuit implementation shown in FIG. 2 gives rise to overvoltages that cause a pulsed voltage increase at the drain pad to values of about −22V.

In prior devices, the method typically used to reduce $VL_{par}$ consisted in driving the MOSFET technology output stage 1A with a voltage step having a sufficiently slow rise time so that the MOS transistor M1 and the derivative of the current to the source pad 4 can be slowed down.

The drawback of this method is that the MOS transistor M1 is typically turned on in a fixed manner, without accounting for any changes in the parasitic inductance $L_{par}$, for the features of the load $Z_{load}$, and for the MOS transistor M1 itself.

Also, the voltage that drives the MOS transistor M1 cannot be simply "shaped" to adequately control the $L_{par}dI/dt$ without using costly circuit arrangements.

BRIEF SUMMARY

In view of the above, the object of the present disclosure is to reduce or minimize the overvoltages at the ends of the parasitic inductance.

In accordance with one embodiment of the present disclosure, a circuit is provided, circuit including an integrated circuit having a power output stage, at least one first pad, one second pad, one drive circuit for driving said power output stage, and at least one additional third pad, other than said at least one first and said at least one second pads, said drive circuit electrically coupled between said at least one third pad and said power output stage.

In accordance with another embodiment of the present disclosure, the output stage includes power transistor means having a gate terminal, a drain terminal, and a source terminal, said first pad electrically coupled to said drain terminal and said second pad electrically coupled to said source terminal, said drive circuit having a first terminal, a second terminal and a third terminal, said first terminal electrically coupled to said gate terminal, said second terminal electrically coupled to said third pad, and said third terminal electrically coupled to said source terminal.

In accordance with another embodiment of the present disclosure, the output stage includes first power transistor means having a gate terminal, a drain terminal, and a source terminal, said first pad electrically coupled to said drain terminal and said second pad electrically coupled to said source terminal, said drive circuit having a first terminal, a second terminal, and a third terminal, said first terminal electrically coupled to said gate terminal, said second terminal electrically coupled to said third pad, and said third terminal electrically coupled to said source terminal.

In accordance with still yet a further embodiment of the present disclosure, a circuit is provided that includes a first transistor having a first terminal coupled to a first pad, a second terminal coupled to a second pad and a control terminal coupled to a third pad, the integrated circuit further including a drive circuit coupled between the control terminal of the power transistor and the third pad, the circuit further comprising an electrical connection between the second pad and the third pad that is formed external to the integrated circuit.

With the present disclosure, overvoltages caused by parasitic inductances may be controlled by utilizing the parasitic inductances themselves, with a minimal increase of circuit complexity.

Furthermore, the novel package, as well as the integrated circuit, find particular and advantageous use in a car audio class D amplifier.

BRIEF DESCRIPTION OF THE SEVERAL VIEWS OF THE DRAWINGS

The features and advantages of the present disclosure will be more readily appreciated as the same become better understood from the following detailed description of one practical embodiment, which is illustrated without limitation in the annexed drawings, wherein.

DETAILED DESCRIPTION

Figure 5A:
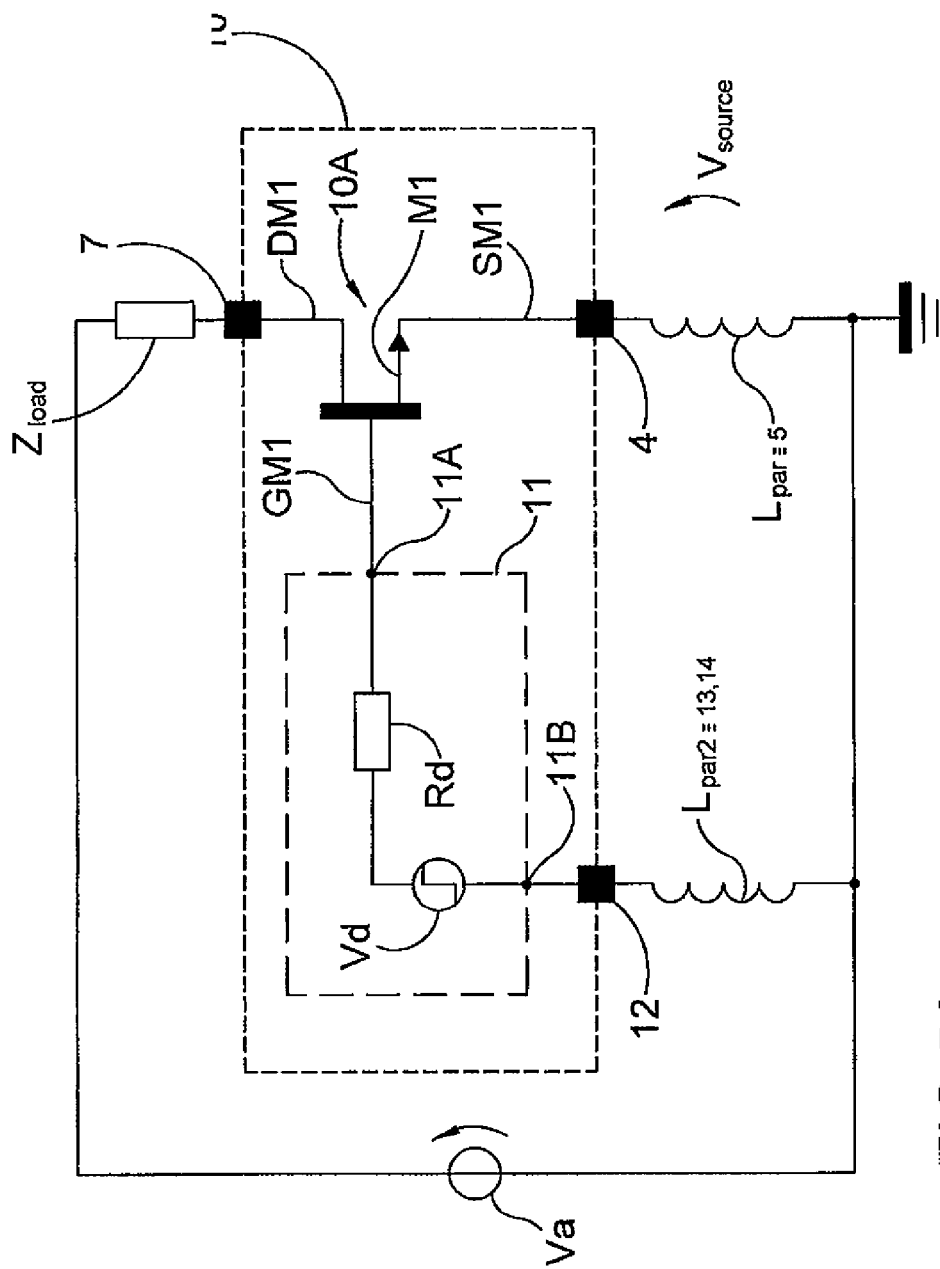
FIG. 5A shows a possible circuit implementation of the integrated circuit according to a first embodiment of the present disclosure.
Figure 5B:
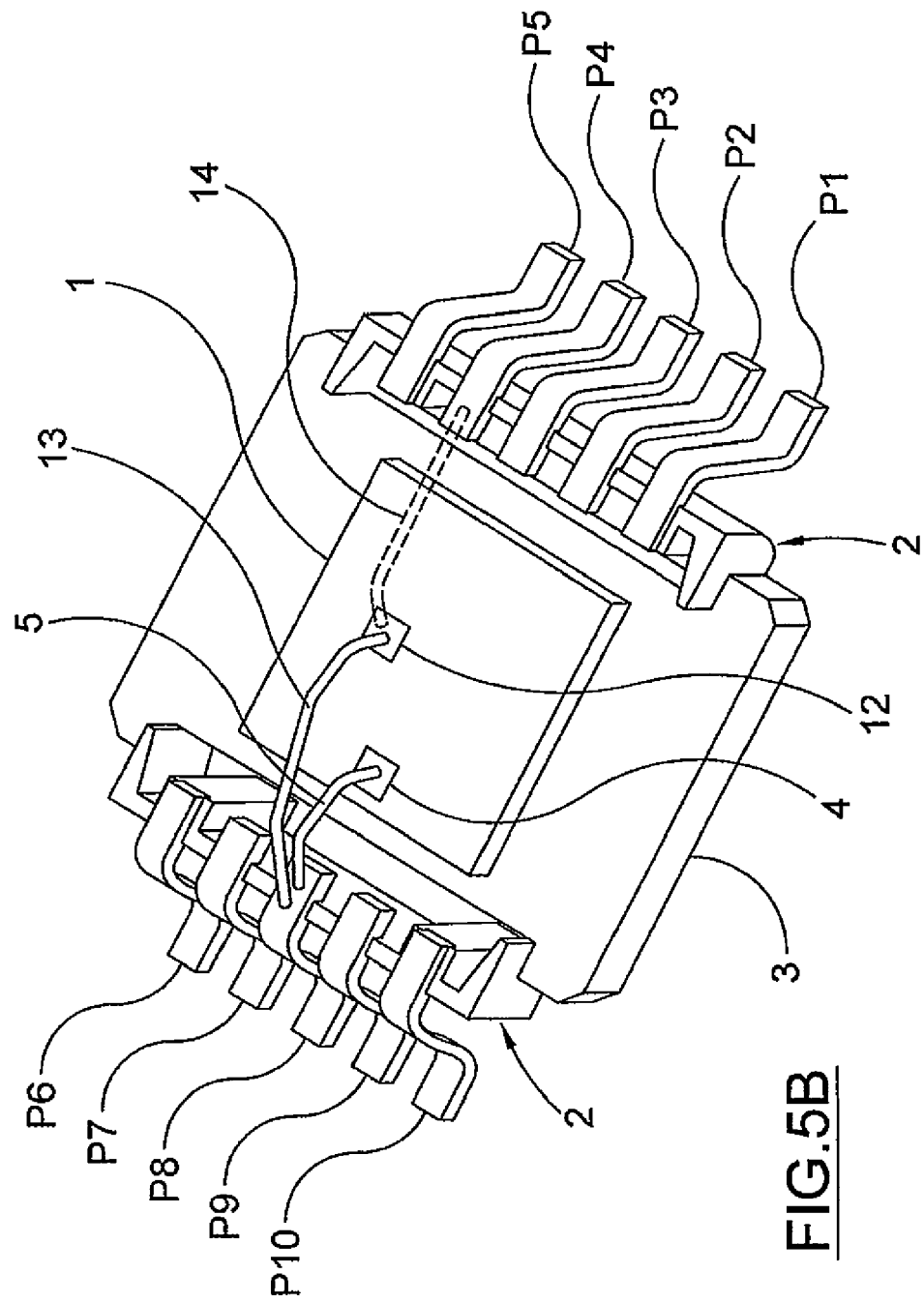
FIG. 5B is a perspective view of a package with an integrated circuit as shown in FIG. 5A thereon.

Referring initially to FIGS. 5A and 5B, which show a first embodiment of the present disclosure, and to certain parts as mentioned above and designated with the same numerals, an integrated circuit 10 is shown to have a power output stage 10A which is driven by a driving stage or drive circuit 11.

The integrated circuit 10 further has at least one first pad 7, one second pad 4 and one third pad 12, other than said first 7 and said second pads 4.

Particularly, the drive circuit 11 is electrically coupled between the third pad 12 and said power output stage 10A.

It shall be noted, namely with reference to FIG. 5B, that the second pad 4 of the integrated circuit 19 is electrically coupled to a pin, e.g., the pin P7 of said plurality of pins P1-P10 of the package 2, and said third pad 12 of the integrated circuit 19 is also electrically coupled to said first pin, e.g., the pin P7, thereby generating a negative feedback that can control any potential difference between said third pad 7 and said second pad 4, as explained in further detail hereafter.

Advantageously, the third pad 12 is electrically coupled to said second pad 4, for instance through a connection wire 13 (as shown in solid lines in FIG. 5b), that can create an electrical connection external to said integrated circuit 10.

Otherwise, still with reference to FIG. 5B, the third pad 12 of the integrated circuit 10 may be arranged to be coupled by means of a connection wire 14 (as shown in dashed lines in FIG. 5B) to another pin, e.g., the pin P4 of the plurality of pins P1-P10 of the package 2, such other pin being a pin other than that with which the second pad 4 is connected.

This configuration also creates a negative feedback that can control any potential difference between said third pad 12 and said second pad 4.

In the specific representation of FIG. 5A, the output stage 10A includes MOSFET power transistor means M1.

The transistor means M1 are implemented as a transistor having a gate terminal GM1, a drain terminal DM1 and a source terminal SM1, where:

the first pad 7 is electrically coupled to said drain terminal DM1 and the second pad 4 is electrically coupled to said source terminal SM1.

The drive circuit 11 comprises a first terminal 11A and a second terminal 11B, where:

the first terminal 11A is electrically coupled to said gate terminal GM1 and the second terminal 11B is electrically coupled to said third pad 12.

In other words, the drive circuit 11 is connected between the gate terminal GM1 of the MOSFET M1 and the third pad 12 of the integrated circuit, said third pad 12 being connected to the source terminal SM1 of the transistor M1 external to the integrated circuit, i.e., downstream from the bonding inductance $L_{par}$.

Thence, it shall be noted that the pad 4 is the source pad of the integrated circuit whereas the pad 12 is the ground pad of the drive circuit 11.

It shall be further noted that the drive circuit 11 comprises voltage generator means Vd and resistor means Rd connected in series with each other, where:

the resistor means Rd have a terminal electrically coupled to said first terminal 11A of said drive circuit 11 and the voltage generator means Vd have a terminal electrically coupled to said second terminal 11B of said drive circuit 11.

For example, the voltage generator means Vd are embodied as a voltage generator integrated in said integrated circuit 10, which can generate a 0 to 3.3V square-wave voltage, and the resistor means Rd are embodied as a resistor integrated in said integrated circuit 10.

It shall be further noted that the connection wire 13 between the pad 12 and the negative pole of the voltage generator Va introduces a further parasitic inductance $L_{par2}$.

The presence of this additional parasitic inductance $L_{par}2$ provides a negative feedback line that can control the voltage at the ends of the gate terminal GM1 and the source terminal SM1 of the transistor M1.

Indeed, assuming that the generator Vd of the drive circuit 6 generates a square-wave voltage, the voltage at the ends of the parasitic inductance $L_{par}$ generated upon turning on of the MOSFET M1 reduces the actual voltage Vgs between the gate terminal GM1 and the source terminal SM1.

Particularly:

$$Vgs=Vd-Rd*Igate-VL_{par}$$

where Igate is the current flowing into the gate terminal GM1 and $VL_{par}$ represents the voltage at the ends of the parasitic inductance $L_{par}$.

For the purposes hereof, the voltage at the ends of the inductance $L_{par2}$ is neglected because, as the MOS M1 is turned on, the current for driving the gate terminal GM1 comes from the positive terminal of the power supply Va and does not flow into the inductance $L_{par2}$.

Figure 2:
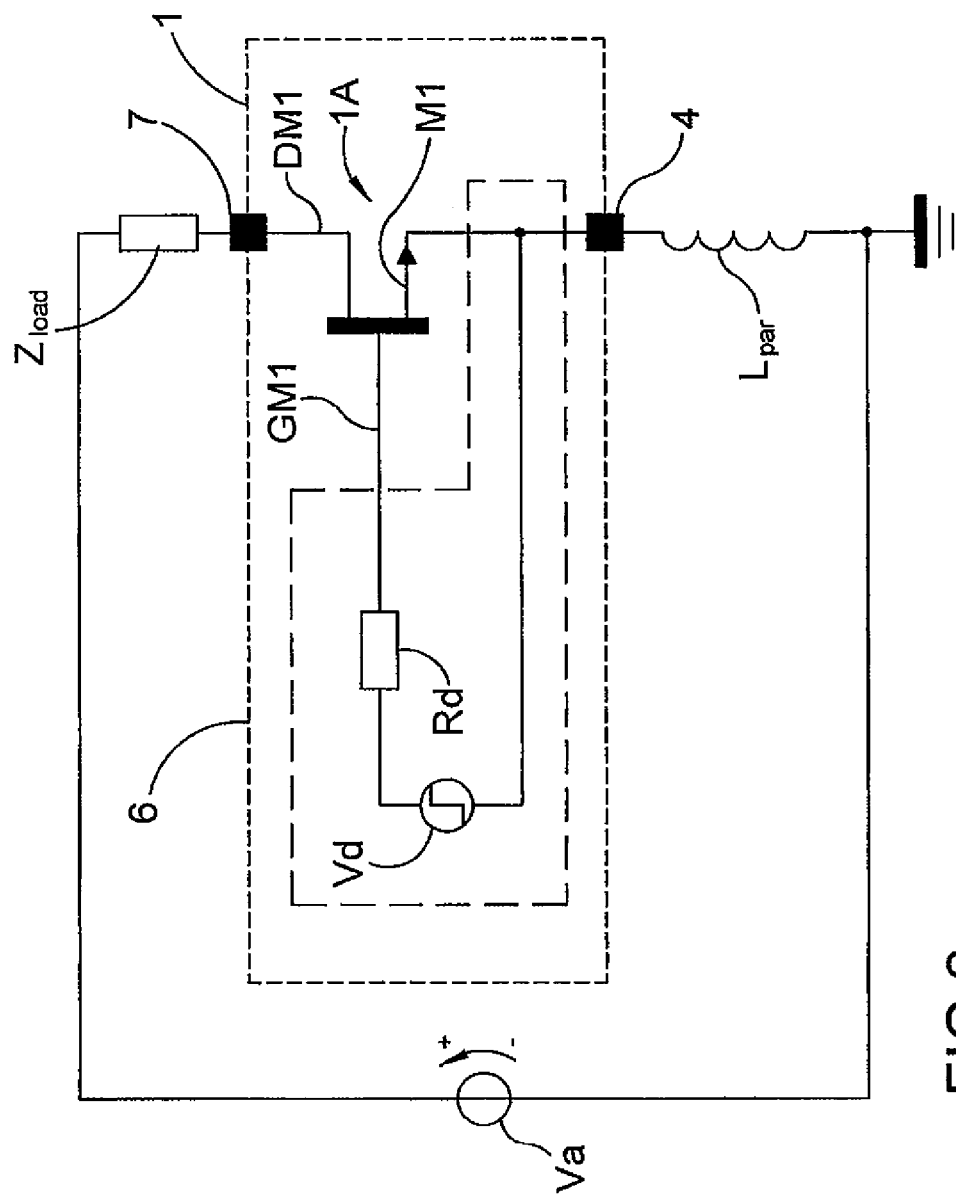
FIG. 2 shows a possible circuit implementation of the integrated circuit as shown in FIG. 1, when connected to a power source, according to prior designs.

It is evident that the voltage Vgs obtained by connecting the drive 11 between the gate terminal GM1 of the MOSFET M1 and the third pad 12 of the integrated circuit, said third pad 12 being in turn connected to the source terminal SM1 of the transistor M1 external to the integrated circuit, is lower than the voltage Vgs obtained in the circuit diagram of FIG. 2.

Figure 3:
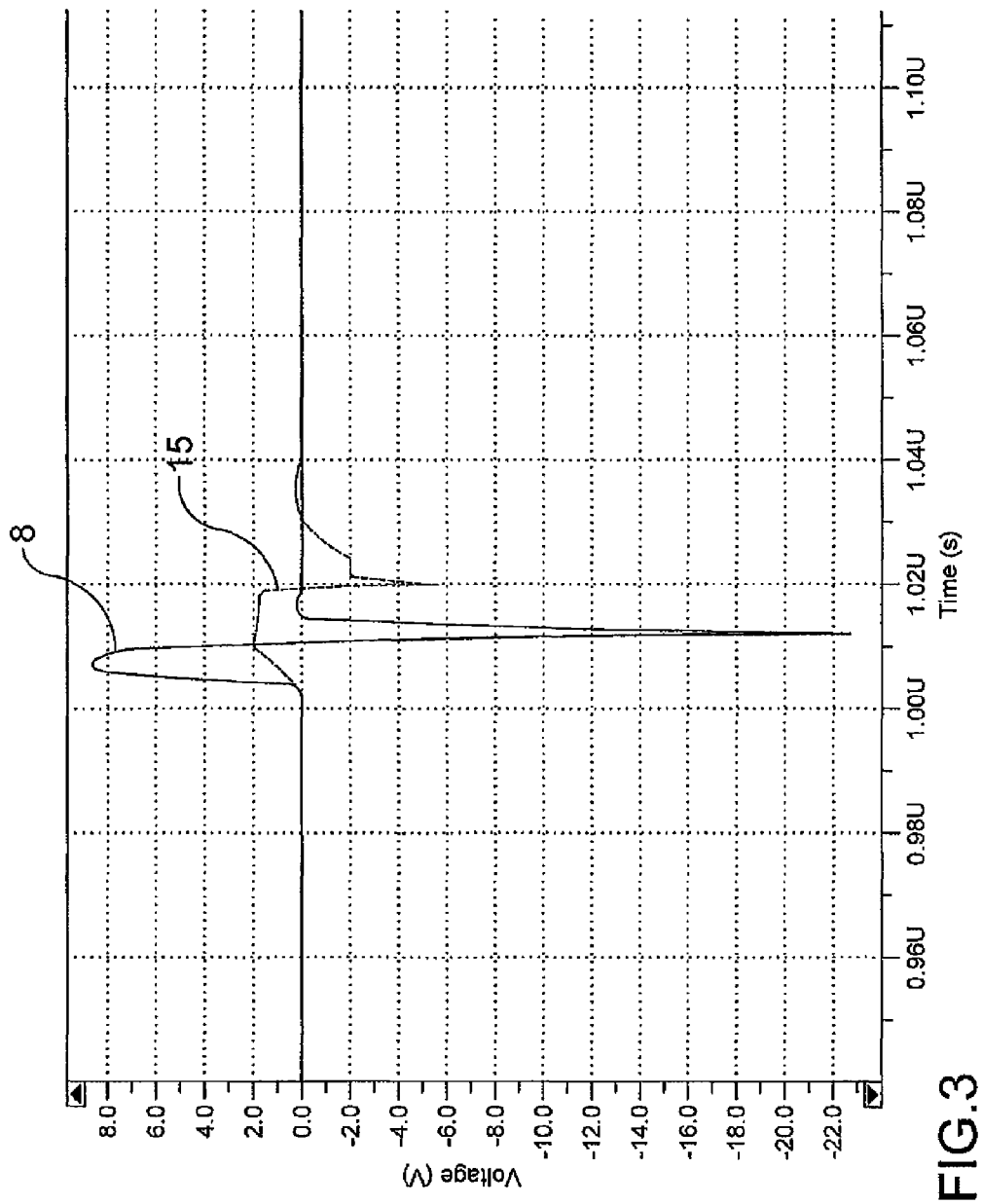
FIGS. 3 and 4 are respective diagrams showing the voltages at the ends of the parasitic inductance (FIG. 3) and the load impedance (FIG. 4) according to the circuit diagram as shown in FIG. 2 in solid lines, and at the ends of the parasitic inductance (FIG. 3) and the load impedance (FIG. 4) according to the present disclosure in dashed lines.
Figure 4:
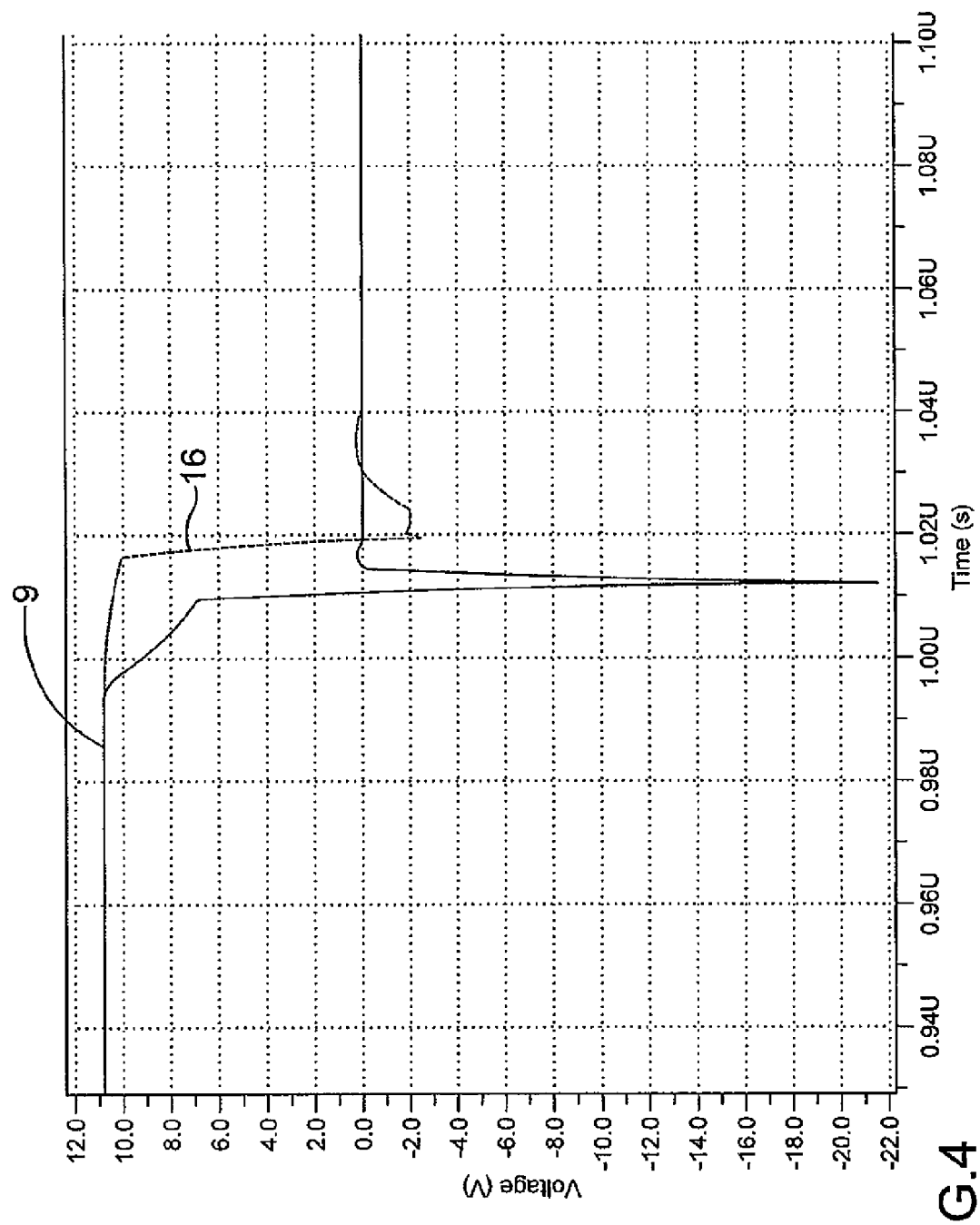

As a confirmation thereof, with further reference to FIGS. 3 and 4, it can be noted that the circuit as shown in FIG. 5A gives rise to source voltages $V_{source}$ (see FIG. 3, dashed line 15) and output voltages $V_{out}$ (see FIG. 4, dashed line 16) much better controlled than the same lines related to the circuit of FIG. 2.

The overvoltages on both the parasitic inductance $L_{par}$ and the load impedance $Z_{load}$ are thus reduced, in this exemplary case, by a factor of about 10.

Figure 6:
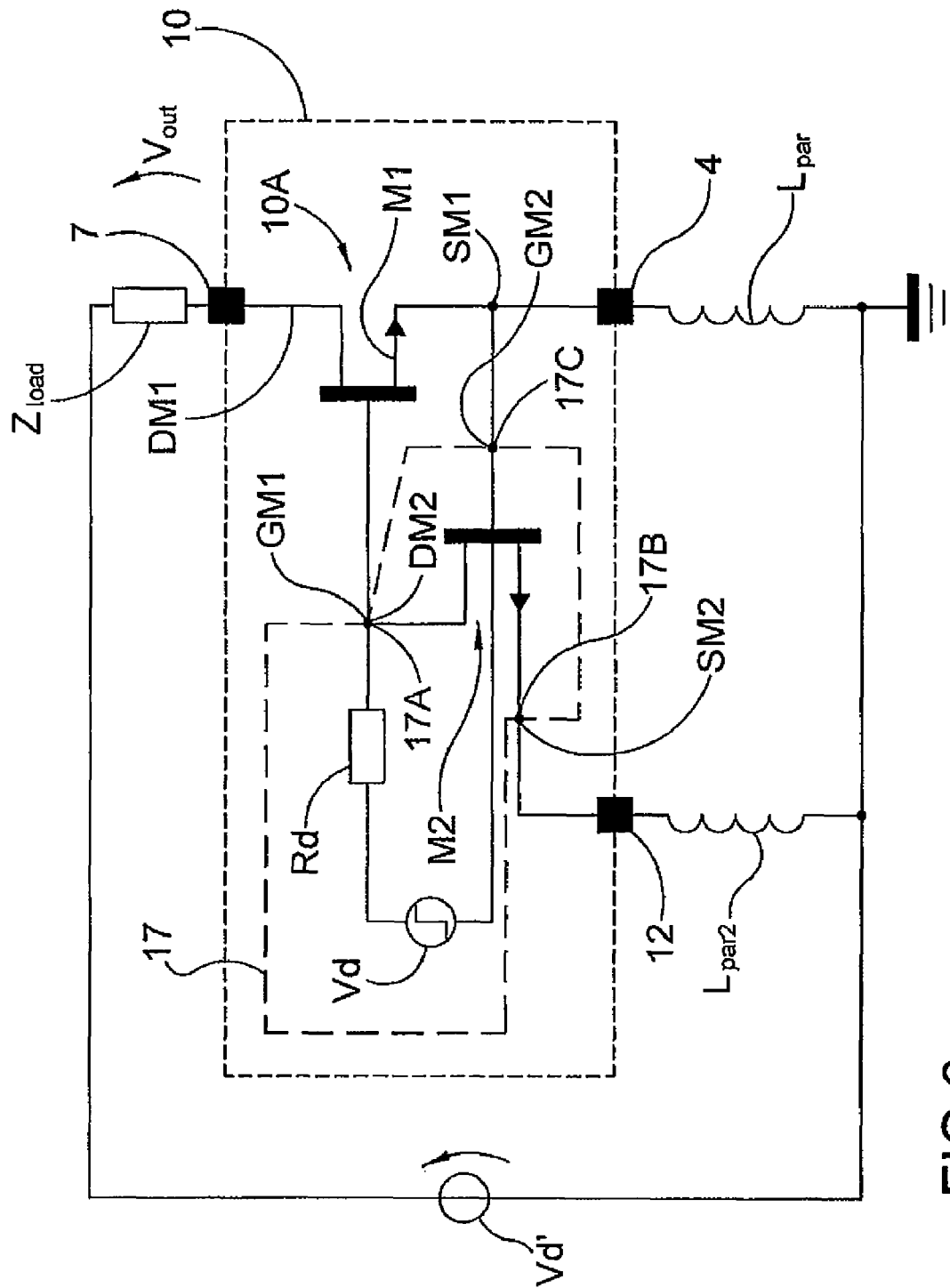
FIG. 6 shows a possible circuit implementation of the integrated circuit according to a second embodiment of the present disclosure.

Referring now to FIG. 6, which shows a second embodiment of the present disclosure, and to certain parts as mentioned above and designated with the same numerals, it can be noted that the output stage 10A comprises transistor means M1 having a gate terminal GM1, a drain terminal DM1, and a source terminal SM1, where the first pad 7 is electrically coupled to said drain terminal DM1 and the second pad 4 is electrically coupled to said source terminal SM1.

It can be further noted that the integrated circuit 10 comprises a drive circuit 17 having a first terminal 17A, a second terminal 17B and a third terminal 17C, where:
the first terminal 17A is electrically coupled to said gate terminal GM1,
the second terminal 17B is electrically coupled to said third pad 12 and
the first terminal 17C is electrically coupled to said source terminal SM1.

Furthermore, the drive circuit 17 comprises voltage generator means Vd and resistor means Rd connected in series with each other and transistor means M2.

Preferably, the transistor means M2 are embodied as a MOSFET signal transistor having a gate terminal GM2, a drain terminal DM2 and a source terminal SM2.

It should be noted that the resistor means Rd and the drain terminal DM2 of the transistor M2 are electrically coupled to the first terminal 17A of said drive circuit 17, whereas the voltage generator means Vd and the gate terminal GM2 of the transistor M2 are electrically coupled to the third terminal 17C of said drive circuit 17 and, finally, the source terminal SM2 of the transistor M2 is electrically coupled to the second terminal 17B of the drive circuit 17.

For example, the voltage generator means Vd are embodied as a voltage generator that can generate a square-wave voltage, and the resistor means Rd are embodied as a resistor, and both are integrated in the integrated circuit 10.

In other words, the drive circuit 17 is directly connected to the source terminal SM1 of the power transistor M1, whereas the transistor M2 acts as a voltage sensor for sensing the voltage value at the ends of the parasitic inductance $L_{par}$.

Indeed, assuming that the generator Vd of the drive circuit 17 generates a square-wave voltage, if the voltage $VL_{par}$ at the ends of the parasitic inductance $L_{par}$ generated upon turning on of the MOSFET M1 is higher than the threshold voltage of the transistor M2, then the latter switches to a conducting state and starts to drain current from the gate terminal GM1 of the power transistor M1, thereby reducing the voltage Vgs at the gate terminal GM1 and the source terminal SM1 by a predetermined value.

Particularly, the voltage Vgs is reduced by a value that corresponds to the current flowing into the drain terminal DM2 of the transistor M2 by the resistance value of the resistor Rd.

In other words:

$$Vgs=Vd-Rd*Igate-Id_{M2}*Rd$$

where $Id_{M2}$ represents the value of current flowing into the drain terminal DM2 of the transistor M2.

Therefore, the effect of this circuit, as shown in FIG. 6, is equivalent to that of the circuit as described above with reference to FIG. 5A.

Thus, the overvoltages on both the parasitic inductance $L_{par}$ and the load $Z_{load}$ are reduced, in this exemplary case, by a factor of about 10 to 20.

Figure 7:
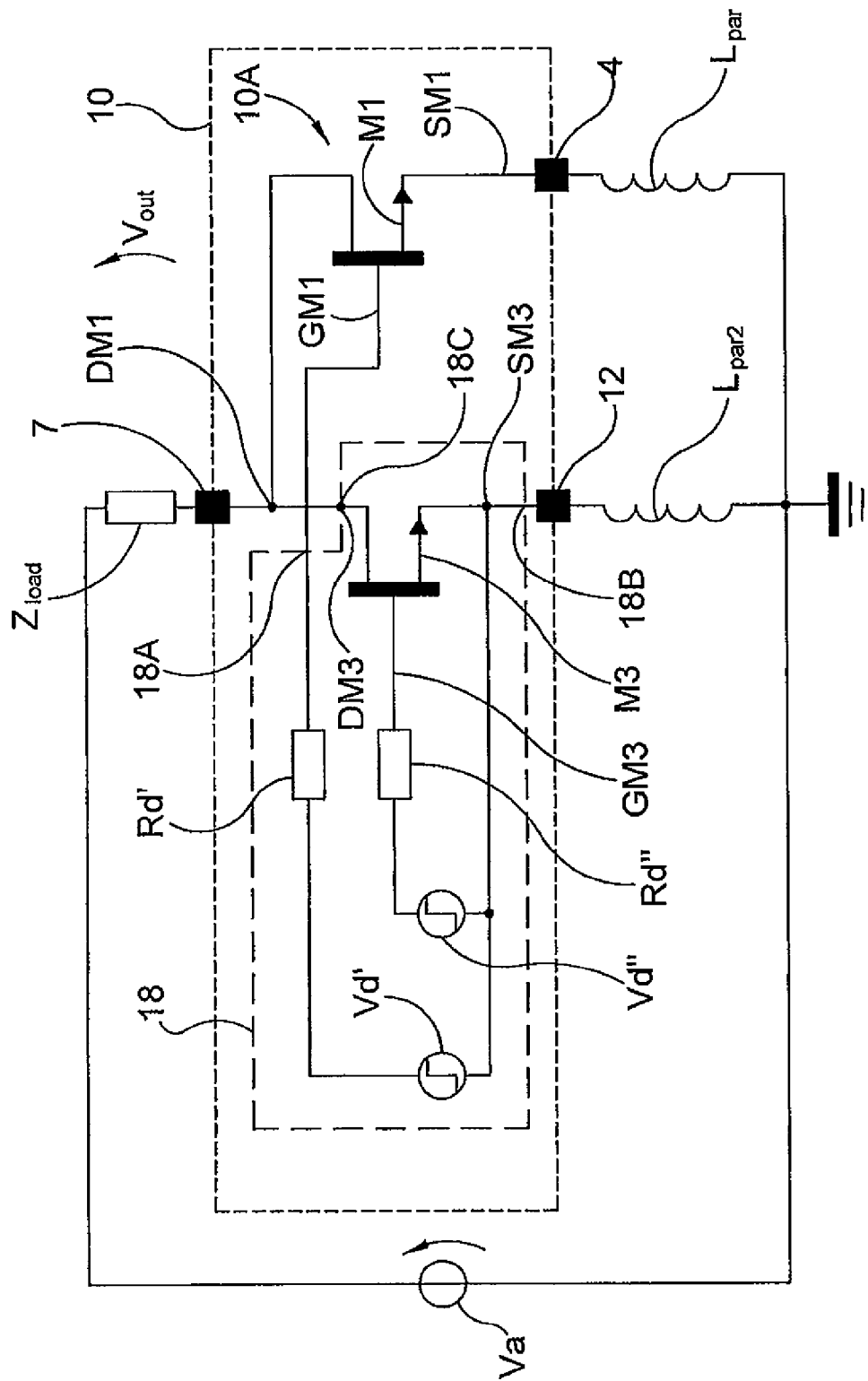
FIG. 7 shows a possible circuit implementation of the integrated circuit according to a third embodiment of the present disclosure.

Referring now to FIG. 7, which shows a third embodiment of the present disclosure, and to certain parts as mentioned above and designated with the same numerals, the integrated circuit 10 is shown to have a power output stage 10A with first power transistor means M1 having a gate terminal GM1, a drain terminal DM1 and a source terminal SM1.

The integrated circuit 10 has a first pad 7 electrically coupled to said drain terminal DM1 and a second pad 4 electrically coupled to said source terminal SM1.

The integrated circuit 10 further comprises a drive circuit 18 having a first terminal 18A, a second terminal 18B and a third terminal 17C, where:
the first terminal 18A is electrically coupled to said gate terminal GM1,
the second terminal 18B is electrically coupled to said third pad 12 and
the third terminal 18C is electrically coupled to said drain terminal DM1.

The drive circuit 18 further comprises first voltage generator means Vd' connected in series with first resistor means Rd', second voltage generator means Vd" connected in series with second resistor means Rd" and second power transistor means M3.

It should be noted that the second power transistor means M3 are obtained by separation from the first power transistor means M1.

In other words, the sum of the regions covered by the first power transistor means M1 and the second power transistor means M3 is equal to the region that would have been covered by a single power transistor dedicated to the same purpose.

Typically, but without limitation, the first power transistor means M1 and the second power transistor means M3 have similar sizes.

Preferably, the first power transistor means M1 and the second power transistor means M3 are implemented using MOSFET technology.

Still referring to FIG. 7, it can be noted that the drive circuit 18 has two separate drive circuits, wherein the first drive circuit comprises the first voltage generator means Vd' connected in series to first resistor means Rd' and is designed to drive the power MOS transistor M1 on and off, whereas the second drive circuit comprises the second voltage generator means Vd" connected in series with second resistor means Rd" and is designed to drive the power MOS transistor M3 on and off.

It should be noted that such drive circuits rely on the source terminal of the second power MOS transistor M3, so that, during the first step, i.e., as the MOS M1 is turned on, the pad 12 as shown in FIG. 7 behaves exactly like the pad 12 as shown in FIG. 5A, and is substantially unaffected by the presence of the source terminal of M3.

Particularly, the power MOS transistor M3 has a gate terminal GM3, a drain terminal DM3 and a source terminal SM3.

Furthermore:
the first resistor means Rd' are electrically coupled to the first terminal 18A of said drive circuit 18,
the second resistor means Rd" are electrically coupled to said gate terminal GM3 of the second power transistor means M3,
the first Vd' and second Vd" voltage generator means and said source terminal SM3 of said second power transistor means M3 are electrically coupled to the second terminal 18B of said drive circuit 18,
the drain terminal DM3 of said second power transistor means M3 are electrically coupled to the third terminal 18C of said drive circuit 18.

Figure 1:
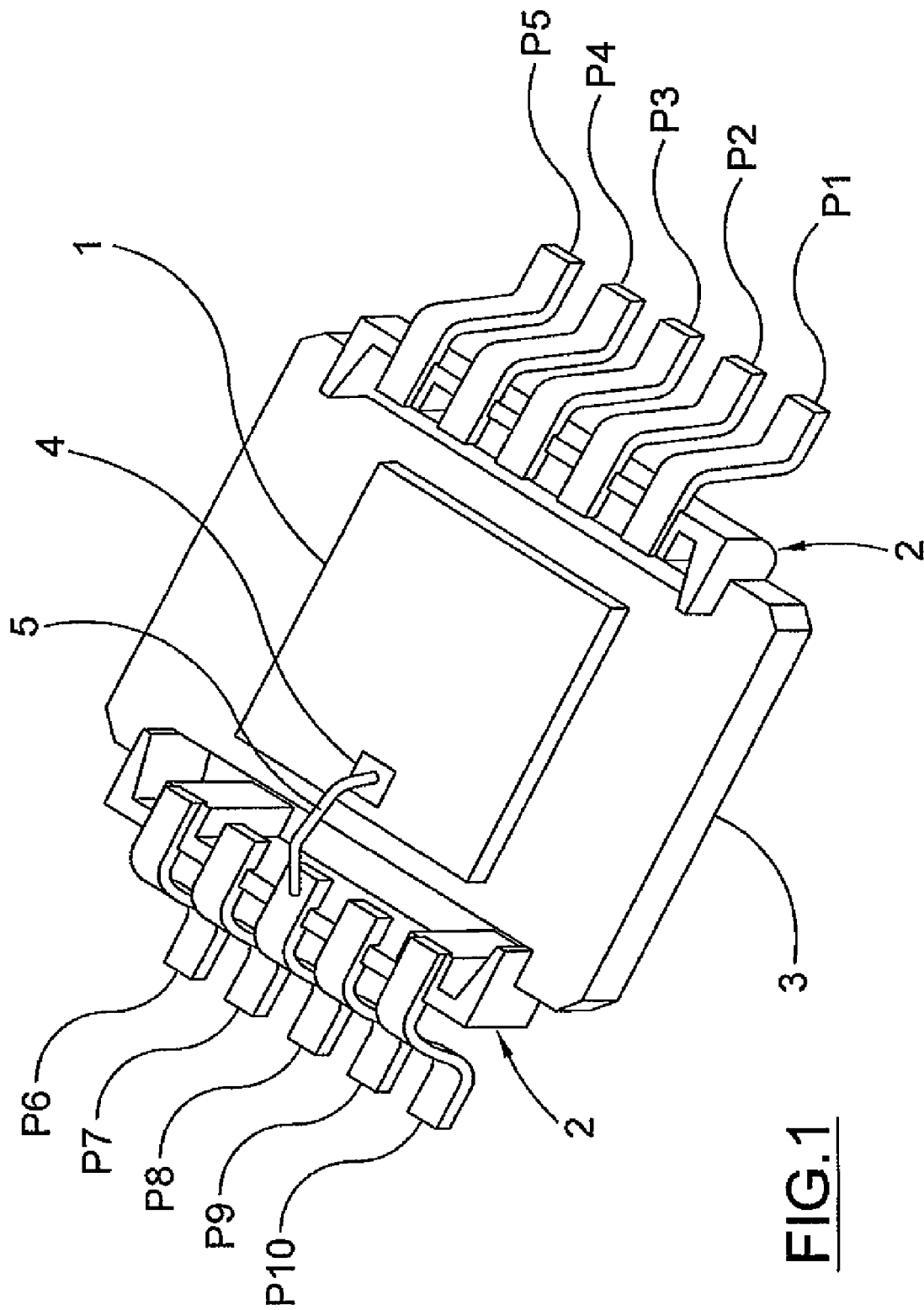
FIG. 1 is a perspective view of a package with an integrated circuit thereon, according to the prior art.

Therefore, it is as if the MOS transistor M1 represented in the circuit of FIG. 1 were divided into two separate power MOS transistors, whose source terminals SM1 and SM3 are connected using two separate pads and two separate connection wires, i.e., the pad 4 and the wire 5 (MOS M1) and the pad 7 and the connection wire 13 (MOS M3) respectively, to the same pin, e.g., P7, of the package 2.

Otherwise, the source terminals SM1 and SM3 are connected using two separate pads and two separate connection wires, i.e., the pad 4 and the wire 5 (MOS M1) and the pad 12 and the connection wire 14 (MOS M3) respectively, to two separate pins, e.g., the pin P7 and the pin P4, of the package 2.

Since the considerable current output often imposes the provision of twice as many pads and wires for connection to the power outputs, this circuit implementation requires no area increase with respect to standard solutions, as shown in FIG. 2.

Figure 8:
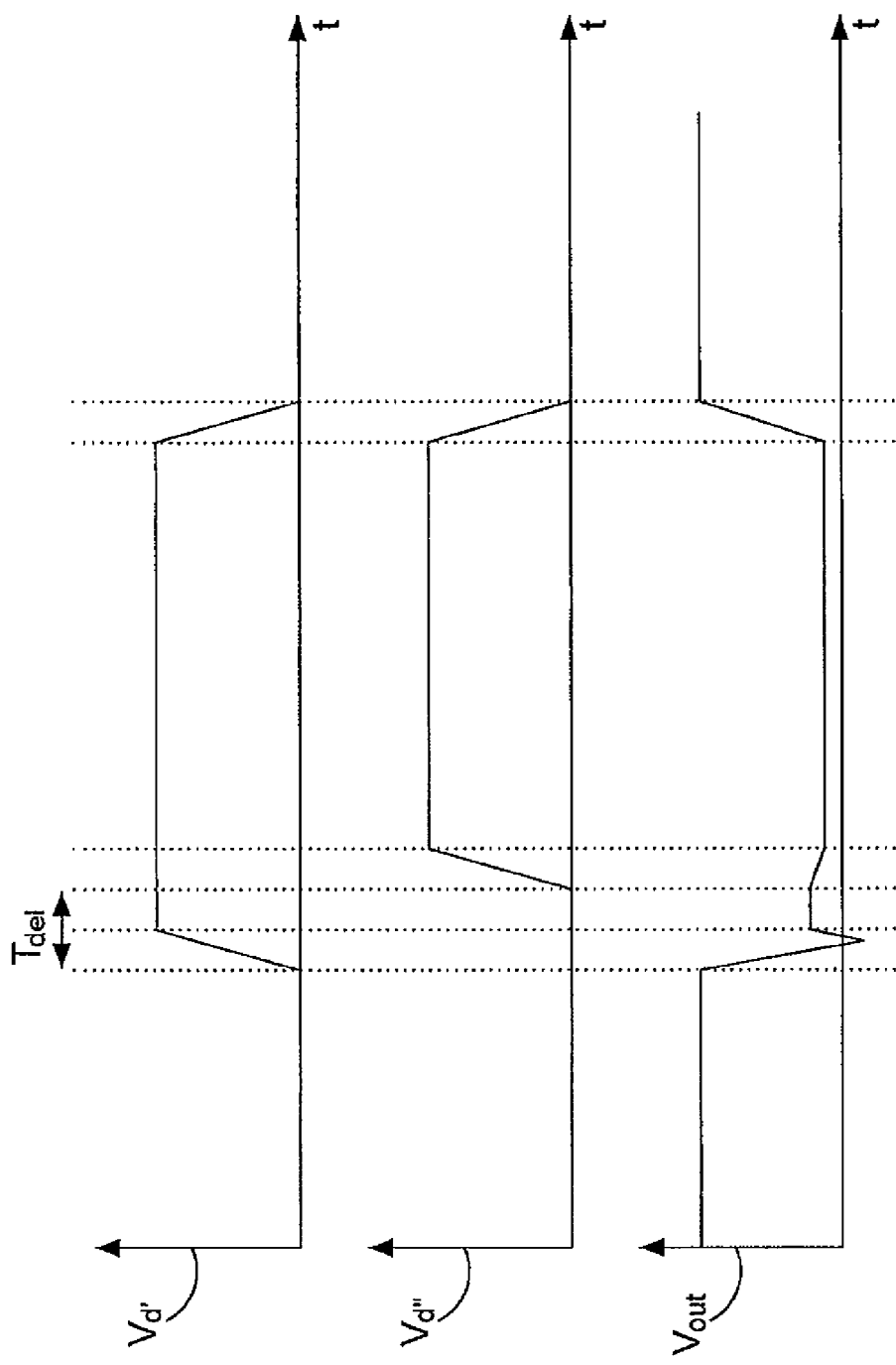
FIG. 8 shows multiple diagrams, representing the voltages of certain characteristic points of the circuit implementation of FIG. 7 as a function of time.

It should be noted that, with further reference to FIG. 8, which shows the voltage diagrams of the voltage generator Vd' and Vd", as well as the voltage $V_{out}$ at the ends of the load $Z_{load}$, the MOS transistor M3 is arranged to be driven on and off with a delay $T_{del}$ relative to the turning on and off of the first transistor M1.

It should be further noted that the characteristic of delayed $T_{del}$ driving of the MOS M3 with respect to the first transistor M1 is of essential importance.

Thus, as shown in FIG. 8, the transistor M3 is turned on after a predetermined time, equal to $T_{del}$ as the voltage rise time of the generator Vd" is delayed by $T_{del}$ with respect to the voltage rise time of the generator Vd'.

For example, for the transistor M3 to be turned on and/or off with a predetermined delay $T_{del}$ with respect to the transistor M1, an appropriate control logic (not shown) is implemented in the integrated circuit 10.

Thus, since at the start the transistor M3 is off, the integrated circuit 10 behaves like that as shown in FIG. 5A.

Once the time $T_{del}$, typically of the order of tens of nsec, has elapsed, the second MOS transistor M3 can also be turned on.

As shown in the diagram of the output voltage $V_{out}$ at the ends of the impedance $Z_{load}$, overvoltages are considerably reduced.

It should be noted that the curves of the output voltage $V_{out}$ at the ends of the impedance $Z_{load}$ and of the overvoltages are qualitatively and quantitatively identical to those as shown in FIGS. 3 and 4.

Concerning the reduction of the voltage Vgs of the MOS transistor M1 when the MOS transistor M3 is also on, it is zero in the steady state, because both transistors M1 and M3 are driven, for instance, with a voltage of 3.3V.

Figure 9:
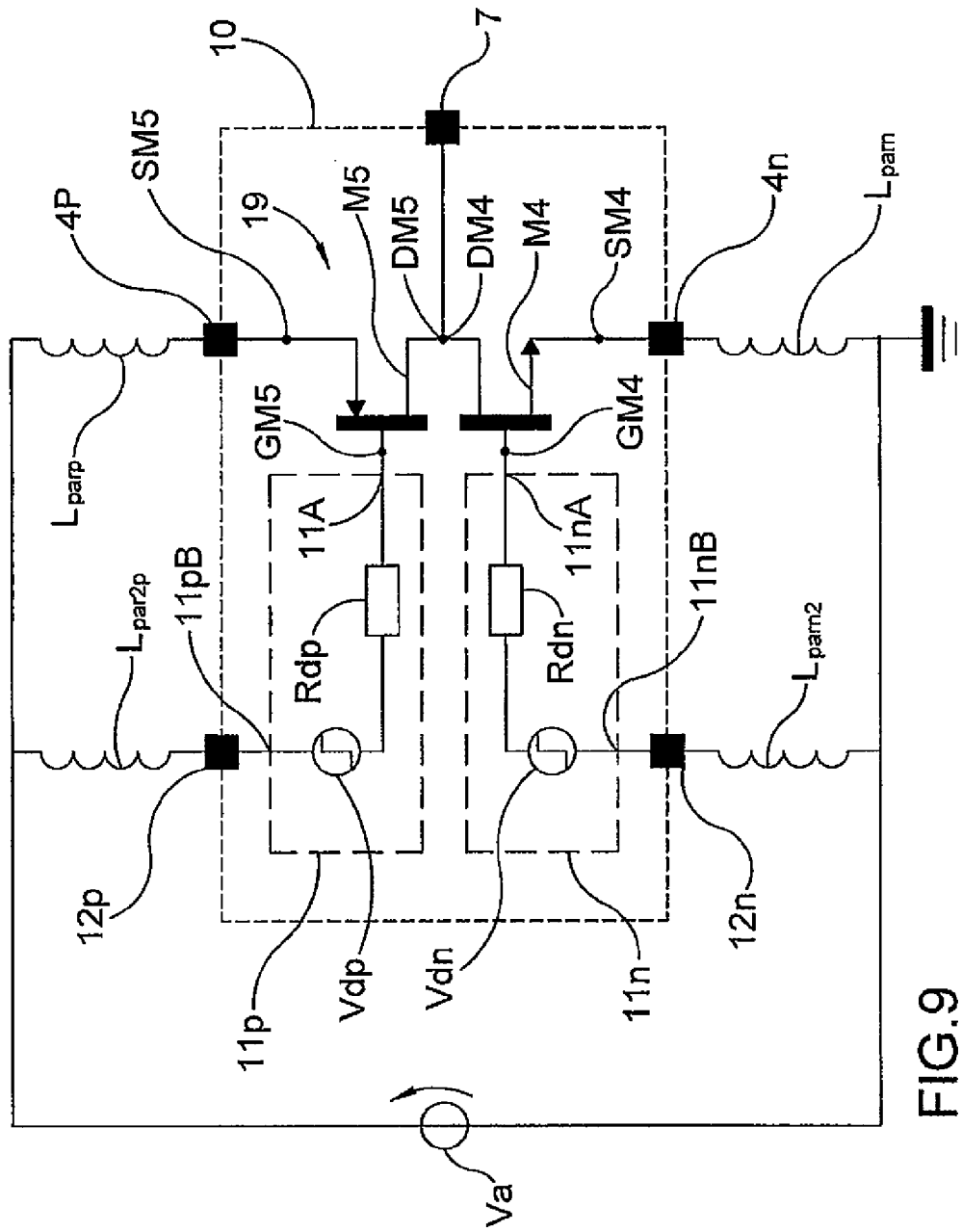
FIG. 9 shows another possible circuit implementation of the integrated circuit of the present disclosure.

It should be also noted, with further reference to FIG. 9 that, if the output stage of the integrated circuit 10 is not a power transistor as shown in FIGS. 5A, 6 and 7, but is implemented as a push-pull output stage 19, circuit implementations for reduction of overvoltages caused by parasitic inductances connected in series with the source terminals of the power MOS transistors might be used on each of the final transistors of such push-pull stages.

As shown in such FIG. 9, in which already described parts are designated by identical numerals, the integrated circuit 10 is shown to comprise a source pad for each type of final transistor M4 and M5, i.e., the integrated circuit has a source pad 4n for the transistor M4 and a source pad 4p for the transistor M5.

Furthermore, each of the transistors M4 and M5 is shown to have its own drive circuit, 11n and 11p respectively, each being electrically coupled between a third pad 12n and 12p respectively and the power output stage 19, and has two terminals, i.e., 11nA, 11nB and 11pA, 11pB respectively.

Finally, each third pad 12n and 12b is also electrically coupled to its respective source pad 4n and 4p, to thereby generate a negative feedback that can control any potential difference between said third pad 12n and 12p and said second pad 4n and 4p.

This embodiment also affords a reduction of overvoltages at the ends of the inductances $L_{parn}$ and $L_{parp}$ respectively, which represent the wires for connection of the source pads 4n and 4p to the pin of the package 2.

While the above embodiments of the present disclosure have been shown to operate using n-channel MOS transistors, such embodiments can obviously be also implemented using p-channel MOS transistors or bipolar NPN power transistors or bipolar PNP power transistors.

Those skilled in the art will appreciate that a number of changes and variants may be made to the arrangements as described hereinbefore to meet specific needs, without departure from the scope of the disclosure, as defined in the following claims.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A circuit, comprising: an integrated circuit having a power output stage with a first transistor having a gate terminal, the integrated circuit further having, a first power pad, a second pad, a drive circuit structured to drive said power output stage, and a third pad, said drive circuit electrically coupled to the third pad and the gate terminal of the first power transistor, and the third pad electrically coupled to said second pad by an electrical connection external to said integrated circuit.

2. The circuit as claimed in claim 1, wherein the first power transistor has, a drain terminal, and a source terminal, said first pad electrically coupled to said drain terminal, and said second pad electrically coupled to said source terminal, said drive circuit having first and second terminals, said first terminal electrically coupled to said gate terminal and said second terminal electrically coupled to said third pad.

3. The circuit as claimed in claim 2, wherein said drive circuit includes a voltage generator and a resistor connected in series with each other, said resistor having a terminal electrically coupled to said first terminal of said drive circuit, and said voltage generator having a terminal electrically coupled to said second terminal of said drive circuit.

4. The circuit as claimed in claim 2, wherein said output stage includes a second power transistor.

5. The circuit as claimed in claim 2, wherein said output stage includes a second power transistor in a push-pull arrangement with the first power transistor.

6. The circuit as claimed in claim 4, wherein said power transistors are n-channel MOS power transistors or p-channel MOS power transistors or bipolar NPN power transistors or bipolar PNP power transistors.

7. The circuit as claimed in claim 1, wherein said output stage comprises a power transistor having a gate terminal, a drain terminal, and a source terminal, said first pad electrically coupled to said drain terminal and said second pad electrically coupled to said source terminal, said drive circuit having a first terminal, a second terminal, and a third terminal, said first terminal electrically coupled to said gate terminal, said second terminal electrically coupled to said third pad, and said third terminal electrically coupled to said source terminal.

8. The circuit as claimed in claim 7, wherein said drive circuit comprises a voltage generator and a resistor connected in series with each other, and a transistor having a gate terminal, a drain terminal, and a source terminal, said resistor and said drain terminal of said transistor electrically coupled to said first terminal of said drive circuit, said voltage generator and said gate terminal of said transistor electrically coupled to said third terminal of said drive circuit, and said source terminal of said transistor electrically coupled to said second terminal of said drive circuit.

9. The circuit as claimed in claim 7, wherein said output stage comprises a second power transistor.

10. The circuit as claimed in claim 7, wherein said output stage comprises two power transistors in push-pull arrangement.

11. The circuit as claimed in claim 10, wherein said power transistors are n-channel MOS power transistors or p-channel MOS power transistors or bipolar NPN power transistors or bipolar PNP power transistors.

12. A circuit, comprising an integrated circuit having a power output stage, a first pad, a second pad, a drive circuit structured to drive said power output stage, and a third pad, said drive circuit electrically coupled between said at least one the third pad and said power output stage, said power output stage including a first power transistor having a gate terminal, a drain terminal, and a source terminal, said first pad electrically coupled to said drain terminal and said second pad electrically coupled to said source terminal, said drive circuit having a first terminal, and a second terminal, said first terminal electrically coupled to said gate terminal and said second terminal electrically coupled to said third pad.

13. The circuit as claimed in claim 12, wherein said drive circuit includes a third terminal electrically coupled to said source terminal, a first voltage generator connected in series with a first resistor, a second voltage generator connected in series with a second resistor, and a second power transistor having a gate terminal, a drain terminal, and a source terminal, said first resistor electrically coupled to said first terminal of said drive circuit, said second resistor electrically coupled to said gate terminal of said second power transistor, said first and second voltage generators and said source terminal of said second power transistor electrically coupled to said third terminal of said drive circuit, and said drain terminal of said second power transistor electrically coupled to said third terminal of said drive circuit.

14. The circuit as claimed in claim 12, wherein said output stage comprises a power transistor.

15. The circuit as claimed in claim 1, wherein said output stage comprises two power transistors in push-pull arrangement.

16. The circuit as claimed in claim 15, wherein said power transistors are n-channel MOS power transistors or p-channel MOS power transistors or bipolar NPN power transistors or bipolar PNP power transistors.

17. A package, comprising:
a plurality of external pins, a connection die, and an integrated circuit the integrated circuit having a power output stage, a first pad, a second pad, a drive circuit structured to drive said power output stage, and a third pad, said drive circuit electrically coupled between said third pad and said power output stage, said second pad electrically coupled to a first pin of said plurality of pins by a first connection wire, said third pad electrically coupled to said first pin by a second connection wire or to a second pin of said plurality of pins, thereby creating a negative feedback path to control overvoltages generated at the ends of said first or second connection wires.

18. A D class amplifier, comprising:
a package that includes a plurality of external pins, a connection die, and an integrated circuit, the integrated circuit having a power output stage, a first pad, a second pad, a drive circuit structured to drive said power output stage, and a third pad, said drive circuit electrically coupled between said third pad and said power output stage, said second pad electrically coupled to a first pin of said plurality of pins by a first connection wire, said third pad electrically coupled to said first pin by a second connection wire or to a second pin of said plurality of pins, thereby creating a negative feedback path to control overvoltages generated at the ends of said first or second connection wires.

19. A circuit, comprising:
an integrated circuit that includes a first transistor having a first terminal coupled to a first pad, a second terminal coupled to a second pad and a control terminal coupled to a third pad, the integrated circuit further including a first drive circuit coupled between the control terminal of the first transistor and the third pad; and an inactive device coupled between the second pad and the third pad via an electrical conductor that is formed external to the integrated circuit and provides a negative feedback path to the control terminal.

20. The circuit of claim 19, wherein the drive circuit includes a voltage generator and resistance element series coupled between the control terminal of the first transistor and the third pad.

21. The circuit of claim 20, wherein the voltage generator has a first terminal coupled to the third pad and a second terminal coupled to a first terminal of the resistance element, and a second terminal of the resistance element is coupled to the control terminal of the first transistor.

22. The circuit of claim 21 wherein the first transistor comprises n-channel MOS power transistors or p-channel MOS power transistors or bipolar NPN power transistors or bipolar PNP power transistors.

23. The circuit of claim 20 comprising a second transistor series coupled with the first transistor in a push-pull arrangement.

24. The circuit of claim wherein the second transistor has a first terminal coupled to the first pad, a second terminal coupled to the first terminal of the first transistor, and a control terminal coupled to a fourth pad.

25. The circuit of claim 24, comprising a second drive circuit coupled between the control terminal of the second transistor and the fourth pad.

26. The circuit of claim 24, wherein the second drive circuit comprises a voltage source coupled in series with a resistance element between the control terminal of the second transistor and the fourth pad.

27. The circuit of claim 19, wherein the first drive circuit comprises a second transistor having a first terminal coupled to the control terminal of the transistor, a second terminal coupled to the third pad, and a gate terminal coupled to the second pad and to a first terminal of a voltage generator that in turn has a second terminal coupled to a resistance element that is itself coupled to the control terminal of the first transistor.

28. The circuit of claim 19, wherein the first drive circuit comprises a second transistor having a first terminal coupled to the first terminal of the first transistor, a second terminal coupled to the third pad, and a gate terminal coupled to the third pad via a first series coupled voltage generator and resistance element, the first drive circuit further including a second series coupled voltage generator and resistance element coupled between the third pad and the control terminal of the first transistor.

29. The package of claim 17, wherein said output stage comprises a first power transistor having a gate terminal, a drain terminal, and a source terminal, said first pad electrically coupled to said drain terminal, and said second pad electrically coupled to said source terminal, said drive circuit having first and second terminals, said first terminal electrically coupled to said gate terminal and said second terminal electrically coupled to said third pad.

30. The package of claim 17, wherein said drive circuit comprises a voltage generator and a resistor connected in series with each other, said resistor having a terminal electrically coupled to said first terminal of said drive circuit, and said voltage generator means having a terminal electrically coupled to said second terminal of said drive circuit.

31. The amplifier of claim 18, wherein said output stage comprises a first power transistor having a gate terminal, a drain terminal, and a source terminal, said first pad electrically coupled to said drain terminal, and said second pad electrically coupled to said source terminal, said drive circuit having first and second terminals, said first terminal electrically coupled to said gate terminal and said second terminal electrically coupled to said third pad.

32. The amplifier of claim 18, wherein said drive circuit comprises a voltage generator and a resistor connected in series with each other, said resistor having a terminal electrically coupled to said first terminal of said drive circuit, and said voltage generator means having a terminal electrically coupled to said second terminal of said drive circuit.

33. The circuit of claim 12, wherein said drive circuit comprises a voltage generator and a resistor connected in series with each other, and a transistor having a gate terminal, a drain terminal, and a source terminal, said resistor and said drain terminal of said transistor electrically coupled to said first terminal of said drive circuit, said voltage generator and said gate terminal of said transistor electrically coupled to said third terminal of said drive circuit, and said source terminal of said transistor electrically coupled to said second terminal of said drive circuit.

34. A circuit, comprising an integrated circuit having a power output stage, a first pad, a second pad, a drive circuit structured to drive the power output stage, and a third pad, the drive circuit electrically coupled to the third pad and the power output stage, the power output stage including a first power transistor having a gate terminal, a drain terminal, and a source terminal, the first pad electrically coupled to the drain terminal, and the second pad electrically coupled to the source terminal, the drive circuit having first and second terminals, the first terminal electrically coupled to the gate terminal and the second terminal electrically coupled to the third pad.

35. The circuit as claimed in claim 34, wherein the drive circuit includes a voltage generator and a resistor connected in series with each other, the resistor having a terminal electrically coupled to the first terminal of the drive circuit, and the voltage generator having a terminal electrically coupled to the second terminal of the drive circuit.

36. The circuit as claimed in claim 34, wherein the output stage includes a second power transistor.

37. The circuit as claimed in claim 34, wherein the output stage includes a second power transistor in a push-pull arrangement with the first power transistor.

38. A circuit, comprising:
an integrated circuit that includes a first transistor having a first terminal coupled to a first pad, a second terminal coupled to a second pad and a control terminal coupled to a third pad, the integrated circuit further including a first drive circuit coupled between the control terminal of the first transistor and the third pad, the drive circuit having a voltage generator and resistance element series coupled between the control terminal of the first transistor and the third pad; and
an external connection between the second pad and the third pad that is formed external to the integrated circuit.

39. The circuit of claim 38, wherein the voltage generator has a first terminal coupled to the third pad and a second terminal coupled to a first terminal of the resistance element, and a second terminal of the resistance element is coupled to the control terminal of the first transistor.

40. The circuit of claim 38 comprising a second transistor series coupled with the first transistor in a push-pull arrangement.

41. The circuit of claim 40 wherein the second transistor has a first terminal coupled to the first pad, a second terminal coupled to the first terminal of the first transistor, and a control terminal coupled to a fourth pad.

42. The circuit of claim 41, comprising a second drive circuit coupled between the control terminal of the second transistor and the fourth pad.

43. The circuit of claim 42, wherein the second drive circuit comprises a voltage source coupled in series with a resistance element between the control terminal of the second transistor and the fourth pad.

44. A circuit, comprising:
an integrated circuit that includes a first transistor having a first terminal coupled to a first pad, a second terminal coupled to a second pad and a control terminal coupled to a third pad, the integrated circuit further including a drive circuit coupled between the control terminal of the power transistor and the third pad, the drive circuit including a second transistor having a first terminal coupled to the control terminal of the transistor, a second terminal coupled to the third pad, and a gate terminal coupled to the second pad, a resistance element, and a voltage generator having a first terminal coupled to the gate terminal and having a second terminal coupled to the resistance element that is itself coupled to the control terminal of the first transistor; and
an electrical connection between the second pad and the third pad that is formed external to the integrated circuit.

45. The circuit of claim 44, wherein the voltage generator has a first terminal coupled to the third pad and a second terminal coupled to a first terminal of the resistance element, and a second terminal of the resistance element is coupled to the control terminal of the first transistor.

46. The circuit of claim 44 wherein the second transistor has a first terminal coupled to the first pad, a second terminal coupled to the first terminal of the first transistor, and a control terminal coupled to a fourth pad.

47. The circuit of claim 45, comprising a second drive circuit coupled between the control terminal of the second transistor and the fourth pad.

48. The circuit of claim 47, wherein the second drive circuit comprises a voltage source coupled in series with a resistance element between the control terminal of the second transistor and the fourth pad.

49. A circuit, comprising:
an integrated circuit that includes a first transistor having a first terminal coupled to a first pad, a second terminal coupled to a second pad and a control terminal coupled to a third pad, the integrated circuit further including a drive circuit coupled between the control terminal of the power transistor and the third pad, the drive circuit including a second transistor having a first terminal coupled to the first terminal of the first transistor, a second terminal coupled to the third pad, and a gate terminal coupled to the third pad via a first series coupled voltage generator and resistance element, the drive circuit further including a second series coupled voltage generator and resistance element coupled between the third pad and the control terminal of the first transistor; and
an electrical connection between the second pad and the third pad that is formed external to the integrated circuit.

50. The circuit of claim 49 wherein the second transistor is series coupled with the first transistor in a push-pull arrangement.

51. The circuit of claim 49 wherein the second transistor has a first terminal coupled to the first pad, a second terminal coupled to the first terminal of the first transistor, and a control terminal coupled to a fourth pad.

52. The circuit of claim 49, comprising a second drive circuit coupled between the control terminal of the second transistor and the fourth pad.

53. The circuit of claim 52, wherein the second drive circuit comprises a voltage source coupled in series with a resistance element between the control terminal of the second transistor and the fourth pad.

* * * * *

UNITED STATES PATENT AND TRADEMARK OFFICE
CERTIFICATE OF CORRECTION

PATENT NO. : 8,159,796 B2
APPLICATION NO. : 12/209948
DATED : April 17, 2012
INVENTOR(S) : Edoardo Botti et al.

Page 1 of 1

It is certified that error appears in the above-identified patent and that said Letters Patent is hereby corrected as shown below:

Column 10, Line 29:
"The circuit as claimed in claim 1, wherein said output" should read, --The circuit as claimed in claim 12, wherein said output--.

Column 11, Line 23:
"The circuit of claim wherein the second transistor has a" should read, --The circuit of claim 23 wherein the second transistor has a--.

Signed and Sealed this
Seventh Day of August, 2012

David J. Kappos
*Director of the United States Patent and Trademark Office*